United States Patent

Ammon et al.

[15] 3,660,726

[45] May 2, 1972

[54] MULTI-LAYER PRINTED CIRCUIT BOARD AND METHOD OF MANUFACTURE

[72] Inventors: John Preston Ammon, Dallas, Tex.; Frederick T. Inacker, Huntington Valley, both of Pa.

[73] Assignee: Elfab Corporation

[22] Filed: Oct. 12, 1970

[21] Appl. No.: 79,854

[52] U.S. Cl. ....................317/101 CM, 29/626, 29/628, 174/68.5, 317/101 D, 339/17 C, 339/18 B

[51] Int. Cl. ....................H05k 1/14

[58] Field of Search ....................174/68.5; 317/101 CM, 101 CE, 317/101 D, 101 DH; 339/18 B, 17 C, 17 R, 220, 275 B, 221; 29/626, 628, 625

[56] References Cited

UNITED STATES PATENTS

| | | | |
|---|---|---|---|
| 2,502,291 | 3/1950 | Taylor | 174/68.5 U |
| 2,932,772 | 4/1960 | Bowman et al. | 174/68.5 X |
| 3,022,480 | 2/1962 | Tiffany | 174/68.5 U |
| 3,028,573 | 4/1962 | Stoehr | 317/101 CE X |
| 3,340,608 | 9/1967 | Blair et al | 174/68.5 X |
| 3,371,249 | 2/1968 | Prohofsky | 174/68.5 X |
| 2,931,003 | 3/1960 | Huetten et al | 317/101 D X |
| 3,444,617 | 5/1969 | Stricker et al. | 29/626 |

FOREIGN PATENTS OR APPLICATIONS

| | | | |
|---|---|---|---|
| 1,093,857 | 12/1960 | Germany | 317/101 D |

*Primary Examiner*—Darrell L. Clay
*Attorney*—Richards, Harris & Hubbard

[57] ABSTRACT

A multi-layer printed circuit board is constructed by sandwiching a thin insulating sheet between adjacent ones of a plurality of double-sided printed circuit boards. Each of the individual boards is formed with conventional plated-through holes electrically connecting the printed circuitry on opposite sides of the boards. The holes are located on the boards so that when the boards are stacked the holes on adjacent boards are in axial alignment. The individual boards are formed into a single multi-layer board by press fitting a conductive contact down into each one of the axially aligned holes. Frictional engagement of the contacts with the plated walls of the holes mechanically joins the boards into a single unitary structure and connects each one of the axially aligned conductive holes to form an electrical interconnection between the circuitry printed upon each one of the boards.

22 Claims, 5 Drawing Figures

Patented May 2, 1972

3,660,726

INVENTORS:
JOHN P. AMMON
FREDERICK T. INACKER

Richards, Harris & Hubbard
ATTORNEY

MULTI-LAYER PRINTED CIRCUIT BOARD AND METHOD OF MANUFACTURE

BACKGROUND OF THE INVENTION

1. Field of the Invention

The invention relates to the manufacture of multi-layer printed circuit boards, and more particularly, to a method for forming a plurality of single layer printed circuit boards into a multi-layer printed circuit board. The invention has particular utility in forming multi-layer printed circuit boards for eliminating interconnecting back panel wiring.

2. History of the Prior Art

In the past, multi-layer printed circuit boards have been manufactured by sandwiching an insulating sheet between a plurality of single layer printed circuit boards. Each of the boards includes enlarged pad areas thereon which are in vertical alignment with one another. An adhesive is placed between each one of the individual layers and then the boards are temperature and pressure laminated together to form a single, unitary multi-layer printed circuit board. After lamination the pad areas on the boards are drilled through and the material forming the insulative board is then etched back from the hole to remove any burrs or slivers of insulative material. The drilled hole is then plated through all of the layers of the board to electrically interconnect the printed circuitry formed on each one of the individual layers.

Many problems are inherent in the prior art technique for manufacturing multi-layer printed circuit boards. For example, it is difficult to align the conductive pads on the undrilled boards one above the other so that, after lamination, a hole drilled down through all of the boards will pass through the center of each one of the pads. Since the boards are temperature and pressure laminated into a single structure prior to drilling, misdrilling, a malaligned pad or any other minor defect in a single board results in loss of the entire laminated package of several boards.

In the field of interconnecting back panels for printed circuit cards and the like, it is necessary to make cross connections between a plurality of different connector terminals. Previously these interconnections have been made either by wire-wrapped, point-to-point wiring or by the use of conventional multi-layer printed circuit boards as back panels. The multi-layer board of the present invention has particular utility in this field since connector terminals, which are normally used in a back panel anyway, are employed to construct the multi-layer printed circuit board which forms an interconnecting back panel.

The multi-layer printed circuit board and its method of manufacture included in the present invention overcomes many of the problems encountered by prior art techniques and is substantially simpler and cheaper to implement.

SUMMARY OF THE INVENTION

A multi-layer printed circuit board and method of manufacture in which a plurality of printed circuit boards having aligned holes therein are interconnected with one another and bonded together by contacts press fitted down through the aligned holes. More particularly, the invention involves a method for manufacturing a multi-layer printed circuit board from a plurality of printed circuit boards including insulative sheets having patterns of conductive material upon at least one surface thereof and plated holes in the boards extending through portions of the conductive patterns. The boards are stacked to axially align a plurality of the holes, and a layer of insulation having corresponding aligned holes is placed between adjacent ones of the boards. A conductive contact is press fitted through the aligned plated holes in the printed circuit boards to make electrical contact with the conductive patterns adjacent the holes on individual ones of the boards and to frictionally engage the walls of the holes to mechanically join the individual boards into a single, unitary multi-layer printed circuit board.

BRIEF DESCRIPTION OF THE DRAWINGS

For a more complete understanding of the present invention and for further objects and advantages thereof, reference may now be had to the following description taken in conjunction with the accompanying drawings in which.

DETAILED DESCRIPTION

In the packaging of electronic circuitry, printed circuit boards are used to simplify the wiring and interconnection of the many different components and elements which form a desired circuit. Printed circuit boards consist of a sheet of insulative material, for example a fiberglass such as G–10, having a pattern of conductive material formed upon the surface. The "printed wiring" interconnects the different components which are mounted through holes formed in the board. A printed circuit board may have conductive patterns formed on either one, or both, of its faces. In a double-sided board, interconnections between selected parts of the circuitry on one surface of the board are made with circuitry on the opposite surface by plated-through holes which form electrically continuous paths between the two surfaces.

Figure 1:
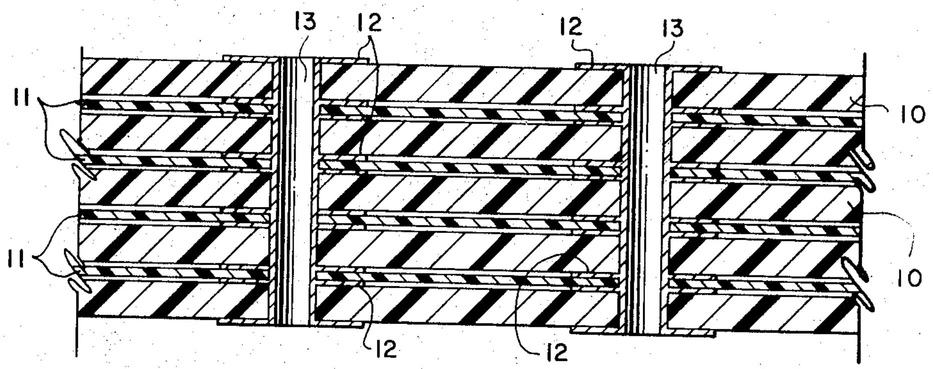
PRIOR ART FIG. 1
FIG. 1 is a cross section view of a multi-layer printed circuit board constructed in accordance with the prior art.

In more complex circuit configurations, it may be desirable to interconnect the circuit pattern on the surfaces of a plurality of different printed circuit boards. The multi-layer printed circuit board and point-to-point wiring techniques were devised to accomplish this purpose. As shown in FIG. 1, prior art multi-layer printed circuit boards consist of a plurality of sheets of insulative material 10 upon which are formed patterns of conductive material. The boards are arranged one above the other in stacks and adjacent surfaces are separated by thin layers of insulative material 11. To interconnect different portions of the circuit patterns on various ones of the boards the circuit patterns on the different boards are designed so that the areas to be electrically connected are in the form of enlarged pads 12 and are vertically aligned one above the other.

In the manufacture of prior art multi-layer printed circuit boards, such as that shown in FIG. 1, each one of the individual printed circuit boards is first made by conventional printed circuit techniques so that the pads are formed in preselected positions on the boards to be interconnected. The boards are then stacked one on top of the other and a thin layer of insulation and a layer of adhesive is applied between each of the adjacent ones of the boards. The pads are then aligned one above the other and the boards are temperature and pressure laminated together into a single multi-layer unitary structure. The laminated board is then drilled so that a hole 13 extends down through and is centered with each one of the pads on the board surfaces to be interconnected. One of the difficulties in the manufacture of prior art multi-layer boards is that it is often very difficult to position the undrilled pads on each of the boards in accurate alignment so that after lamination, a drilled hole will extend through and contact each one of the pads. Misalignment of only one of the pads, misdrilling of a hole, defective plating or any other minor defect in assembly of the boards will cause loss of an entire laminated structure.

After the holes have been drilled in the prior art multi-layer laminated board, the holes are etched and the G–10 insulative material forming the body of the boards is etched back from the walls of the holes to remove any remaining chips or burrs of copper or insulative material. The etched hole 13 is finally plated-through so that conductive material electrically contacts each and every pad on each board forming the laminated structure. The pads are then all electrically connected to complete the circuitry between each of the layers making up the multi-layer board. The plated-through holes 13 are shown in the prior art FIG. 1 multi-layer board to illustrate the manner in which it contacts each one of the pads 12.

Figure 2:
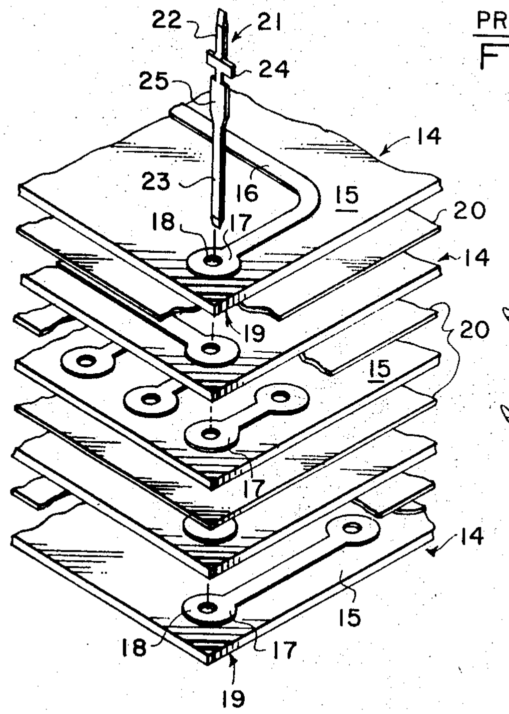
FIG. 2 is an exploded perspective view of a multi-layer printed circuit board constructed in accordance with the present invention.

To avoid the complicated and expensive process of first laminating each of the boards, drilling the board, and finally plating through the hole to make contact, the multi-layer printed circuit board of the present invention is constructed in the manner shown in FIG. 2. Conventional printed circuit board structures 14, which may be either double sided or single sided boards, include a sheet of insulative material 15, such as the board material known as G–10, having formed thereon a plurality of conductive pathways 16. Enlarged pads 17 are formed at locations on the boards 14 which are designed to electrically connect with other points within the multi-layer array. In a double sided board, one of the pads 17 surrounds a hole 18 passing through the board and on the opposite side of the hole is a matching pad 19. Each one of the holes 18 surrounded by the pads 17 and 19 is preferably plated with conductive metal and an outer layer of tin-lead material so that pads 17 and 19 are joined by a continuous metal layer forming the walls of the plated-through hole.

As shown in FIG. 2, each one of the individual boards 14 is manufactured as a single printed circuit board and is initially drilled before plating so that the holes in the different boards having pads to be interconnected will be in axial alignment with one another when the boards are stacked in the multi-layer configuration. Registration of the holes may be easily accomplished by drilling all of the boards simultaneously on a jig or by using precise drilling equipment so that all the holes in successively drilled different boards are accurately positioned. Adjacent boards are separated by a thin layer of insulative material 20 such as "MYLAR" polyester film available from E. I. duPont de Nemours & Co. Each of the sheets 20 are preferably drilled with holes to correspond with those in the boards. As the boards, shown exploded in FIG. 2, are brought together into a stack, the plated-through holes 18 in the pads 17 and 19 on each adjacent board lie above one another and are in axial alignment but are electrically isolated from one another by the thin insulative sheet 20. Certain ones of the holes in the individual single layer boards 14 may not be aligned with holes on other boards but be buried within the stack and serve only to interconnect circuitry from the upper to the lower surface of that one board.

When the boards are stacked together with the plated-through holes 18 and the pads 17 and 19 in vertical alignment a conductive metal contact 21 is press fitted down into the hole 18. The metal contact 21 comprises a connector portion 22 and a shank portion 23 which are separated by a shoulder 24 and an enlarged neck section 25 which is greater in width than the shank 23. The plated-through holes 18 joining the pads 17 and 19 are slightly larger than the shank portion 23 so that the contact 21 will pass readily into the holes. The neck section 25 is slightly larger than the diameter of the hole 18 so that when a contact is press fitted down into a hole there is a snug frictional engagement between the edges **25*a* of the neck section and the plated walls of the hole. Because of the size difference between the neck section 25 and the plated hole 18, the relatively soft tin-lead plating is deformed plastically away from the angular edges 25*a* to form a tight fit between the contiguous parts. The shoulder 24 limits the depth to which a contact 21 may be pressed into a board and also serves to apply compression to the stacked assembly of boards when the contacts are inserted using a perforated back-up plate. The contacts 21 shown in the drawing include neck sections 25 having a rectangular cross section defining four angular edges 25*a*. The shank portion 23 of the contact 21 is substantially square in cross section as is required to permit wiring termination by such techniques as wire wrapping. When the present method is employed in making multi-layer boards for interconnecting back panels, as more particularly described below in connection with FIG. 5, and all the required electrical connections are made the boards, the shank portion 23 of the contacts 24** are no longer necessary and may be clipped off. In certain cases the shanks may be left for use in adding point-to-point wired options to a circuit arrangement on a back panel.

The connector portion 22 of the contact is preferably recessed from one surface of the contact by coining so that they can also be used as component terminations if a plurality of the contacts 21 are arranged on the boards in a proper array, for example, such as is shown in a copending application Ser. No. 9611 entitled Integrated Circuit Connector System filed Feb. 9, 1970, in the name of Frederick T. Inacker and assigned to the assignee of the present invention. The multi-layer board would then form an interconnecting back panel for a plurality of the connectors. It is to be understood, however, that the connector portion 22 of the contact 21 is not essential to the present invention and all that is actually required is a conductive contact which can be press fit down into the plated-through holes 18.

Figure 3:
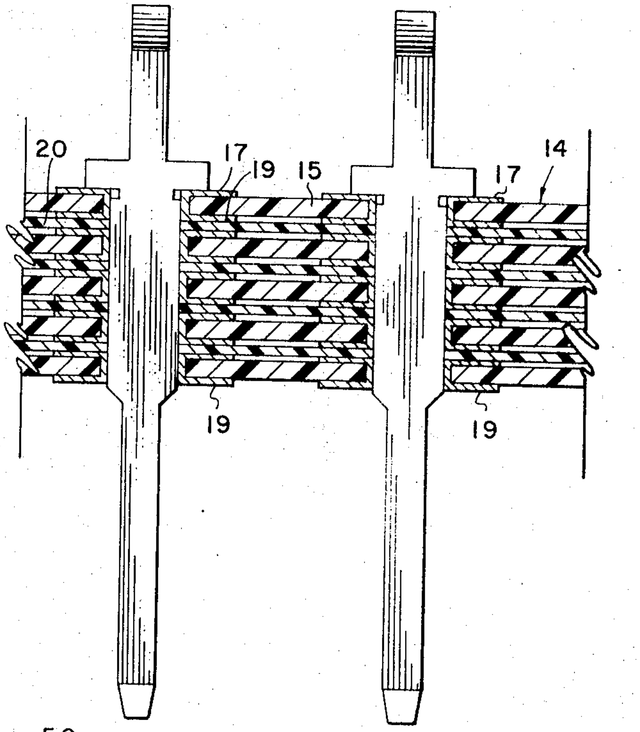
FIG. 3 is a cross section view of a multi-layer printed circuit board constructed in accordance with the invention.

The length of the enlarged neck section 25 of the contact 21 is such that when the boards are in face-to-face engagement with one another separated by the insulative layers 20, the section 25 will extend completely through each of the plated-through holes of all of the stacked circuit boards, as shown in FIG. 3. For example, a contact having a ⅛ inch long neck section can be used to join a stack of two 1/16 inch boards or four layers of 1/32 inch boards, etc. Tight frictional engagement between the walls of the plated-through holes and the neck section 25 of the press fitted contact serves to provide both electrical contact between the pads 17 and 19 on all of the individual ones of the stacked boards and to rigidly join the individual ones of the boards 14 to form the multi-layer board into a single unitary structure.

The method of forming a multi-layer printed circuit board of the invention is much simpler and faster than the prior art technique of first laminating the boards, drilling a hole through the pads and finally plating the drilled holes. The only through-hole plating techniques which are required are those used to form plated-through holes in the individual circuit boards as is well known in the printed circuit board manufacturing art. The joining of the individual boards to form a unitary multi-layer board is performed quickly and easily by simultaneously press fitting a plurality of contacts 21 into the vertically aligned holes. Insertion and press fitting of the contacts 21 into the holes may be efficiently performed in accordance with the invention disclosed and claimed in a copending application Ser. No. 39,089 entitled Method and Apparatus for Manufacturing Connector Terminals filed May 20, 1970, in the name of Jerry A. Kendall and assigned to the assignee of the present invention. As is shown in that application a plurality of contacts 21 are formed on a common support strip of conductive material, and simultaneously press fit down into holes in a board. The common support strip is then broken away to leave the individual contacts press fitted down into the individual holes in the board.

Figure 4:
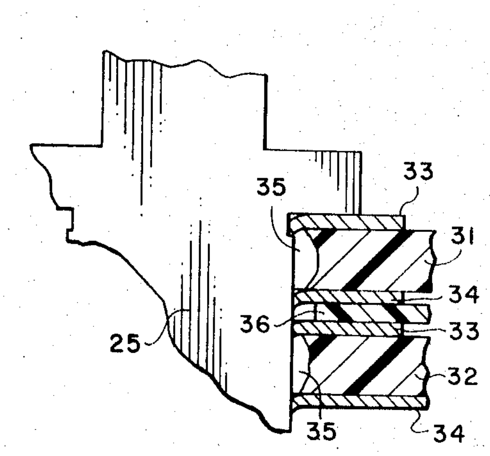
FIG. 4 is a partial cross section view of a multi-layer printed circuit board constructed in accordance with a modification of the present invention.

Other modifications of the present invention may be made. A multi-layer board can be made from a plurality of conventional boards which have non-plated through holes joining the pads on opposite sides. FIG. 4, shows a pair of circuit boards 31 and 32 having conductive pads 33 and 34 formed on opposite sides of a hole passing through the boards. Pads 33 and 34 on the respective boards are not joined by through-hole plating, but rather the boards are processed by etching back a portion of the G–10 insulative material surrounding the holes to form void areas 35 so that there is a slight overhang of conductive metal surrounding the holes. The boards 31 and 32 are separated by a sheet of insulative material 36 and the aligned holes in the boards are filled by a contact 41 having an enlarged neck section 25 press fitted down into the holes as described in connection with FIG. 2 and FIG. 3. The conductive material surrounding the edges of the holes is preferably malleable and is deformed into the holes by insertion of the contact. Good contact with the conductive patterns contiguous to the holes is insured by the overhanging metal portions adjacent the void areas 35. The press fit contact 41 is identical to the contact 21 described in connection with FIG. 2. The tight frictional engagement of the edges of the contact 41 serve to electrically connect the pads 33 and 34 on the boards 31 and 32 and to rigidly join the boards 31 and 32 together into a single unitary multi-layer board.

Figure 5:
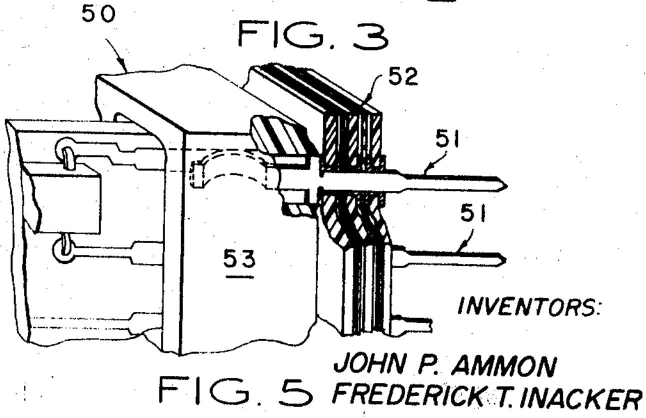
FIG. 5 is a partial cut-away perspective view of a multi-layer printed circuit board constructed in accordance with the invention used as an interconnecting back panel for printed circuit board connectors.

As mentioned above, the method and article of the present invention has particular utility in the manufacture of interconnecting back panels for circuit connectors. FIG. 5 is a partially cut-away perspective view of an interconnecting back panel for a plurality of printed circuit board connectors such as those shown in a copending application Ser. No. 38,989 entitled Printed Circuit Board Connector filed May 20, 1970, in the names of John Preston Ammon and Frederick T. Inacker and assigned to the assignee of the present invention. The connector 50 includes a plurality of conductive contacts 51 which are press fitted through holes in the multi-layer board 52, forming a back panel, to make electrical connection with printed circuitry on various ones of the individual boards and to mechanically form the separate boards into a single unitary structure. An outer shell 53 having an opening to receive a printed circuit card is snapped over the mounted contacts 51. The patterns of conductive material within the multi-layer board interconnects various ones of the contacts 51 with one another and with the contacts of other connectors (not shown) which are also mounted on the same multi-layer back panel 52. The multi-layer board 52 is constructed in the same manner the boards shown in FIGS. 2 and 3 with the only principal difference being the type of contact 51 used. It is to be understood that the precise configuration of the contact 51 is less significant than the fact that the contacts can be press fitted into the aligned holes to form the multi-layer back panel.

In the manufacture of multi-layer boards for use under extreme environmental conditions such as high humidity and large temperature variations, it may be desirable to seal the area between adjacent boards to prevent moisture buildup. If so, a partially cured epoxy resin bonding sheet may be used for the insulative material 20 instead of "MYLAR." After assembly, the boards are held under compression toward one another as a result of the press fitting of the contacts. The partially cured epoxy resin bonding sheet becomes adhesive when heated. The completed multi-layer boards are heated and the compressive pressure due to press fitting causes the sheet material to flow and fill all the small void spaces between the boards. When cooled the sheet material hardens to seal the boards against moisture.

Another further modification of the present method can be used after the completed multi-layer board has been assembled. In conventional printed circuit boards having plated-through holes, the conductive areas are generally plated with a layer of tin-lead material, which may be ordinary 60/40 solder. After assembly the boards are dipped in a hot oil bath having a temperature on the order of 500° F. to melt the solder coatings and "reflow" them into better engagement with the press fitted contacts. This gives a firmly soldered connection which is very reliable for use in extreme environmental conditions. If thin layers of partially cured epoxy resin have been used between the individual boards, the hot oil bath will also serve to cure the layers and seal the boards, as described above.

Having described the invention in connection with certain specific embodiments thereof, it is to be understood that further modifications may now suggest themselves to those skilled in the art and it is intended to cover such modifications as fall within the scope of the appended claims.

What is claimed is:

1. A method for manufacturing a multi-layer printed circuit board comprising the steps of:

stacking a plurality of printed circuit boards including insulative sheets having patterns of conductive material upon at least one surface thereof and holes in said boards extending through portions of said conductive patterns, said holes being plated with a conductive material which is in electrical contact with the conductive pattern adjacent said holes and said boards being stacked to axially align a plurality of said holes; and press fitting a conductive contact having an edge through said aligned holes in said printed circuit boards with said edge deforming the conductive material within said holes on individual ones of said boards and frictionally engaging the conductive material on the walls of said holes mechanically joining the individual boards into a single, unitary multi-layer printed circuit board.

2. A method for manufacturing a multi-layer printed circuit board as set forth in claim 1 wherein the portion of said conductive contact press fitted into the plated holes includes an angular edge engaging and deforming the conductive material on the walls of said holes to form a tight fit therebetween.

3. A method for manufacturing a multi-layer printed circuit board as set forth in claim 2 wherein the conductive material within said holes comprises an inner layer of conductive metal and an outer layer of tin-lead material.

4. A method for manufacturing a multi-layer printed circuit board as set forth in claim 2 wherein the portion of said conductive contact press fitted into the plated holes is rectangular in cross section with four angular edges.

5. A method for manufacturing a multi-layer printed circuit board as set forth in claim 1 which includes the additional step of:

placing a layer of insulation between adjacent ones of the printed circuit boards wherein said layer has a pattern of holes formed therein which corresponds to the pattern of holes in the boards.

6. A method for manufacturing a multi-layer printed circuit board as set forth in claim 1 wherein the portions of the conductive patterns adjacent the holes are in the form of enlarged pads surrounding the edges of the holes.

7. A method for manufacturing a multi-layer printed circuit board as set forth in claim 1 which includes the additional steps of:

placing a layer of insulation between adjacent ones of the printed circuit boards which layer includes a heat curable, uncured epoxy resin; and heating the unitary multi-layer printed circuit board to cure said layer of insulation and seal the boards against moisture.

8. A method for manufacturing a multi-layer printed circuit board from a plurality of double sided single layer printed circuit boards each of which includes a sheet of insulative material having a pattern of conductive material formed on both surfaces thereof and a plurality of holes extending through the board which holes extend through portions of both patterns of conductive material, and are plated with a conductive material which is in electrical contact with the portions of conductive patterns adjacent both ends of said hole, which method comprises the steps of:

stacking a plurality of the single layer printed circuit boards to axially align a plurality of said holes after placing a layer of insulation between adjacent ones of said boards; and press fitting a conductive contact having an edge through the aligned holes in said printed circuit boards with said edge deforming the conductive material within said holes and locking the individual boards into a single, unitary multi-layer printed circuit board by frictional engagement with the conductive material on the walls of said holes.

9. A method for manufacturing a multi-layer printed circuit board as set forth in claim 8 wherein the portion of said conductive contact press fitted into the plated holes includes an angular edge which engages the conductive material on the walls of said holes to deform the conductive material away from said edge and form a tight fit therewith.

10. A method for manufacturing a multi-layer printed circuit board as set forth in claim 9 wherein the conductive material within said holes comprises an inner layer of conductive metal and an outer layer of tin-lead material.

11. A method for manufacturing a multi-layer printed circuit board as set forth in claim 9 wherein the portion of said conductive contact press fitted into the plated holes is rectangular in cross-section with four angular edges.

12. A method for manufacturing a multi-layer printed circuit board as set forth in claim 8 wherein:

the layer of insulation placed between adjacent ones of the printed circuit boards includes a heat curable, uncured epoxy resin and which includes the additional step of heating the unitary multi-layer printed circuit board to cure said layer of insulation and seal the boards against moisture.

13. A multi-layer printed circuit board comprising:

a stack of single layer printed circuit boards each of which includes a sheet of insulative material having a pattern of conductive material formed on at least one surface thereof and holes extending through the boards which holes extend through portions of the pattern of conductive material, said holes being plated with a conductive material which is in electrical contact with the conductive pattern adjacent said holes and said boards being stacked to align a plurality of said holes; and a conductive contact having an edge press fitted through each of said axially aligned plated holes with said edge deforming the conductive material within said holes and frictionally engaging the conductive material on the walls of said holes to lock the individual single layer boards into a unitary multi-layer printed circuit board.

14. A multi-layer printed circuit board as set forth in claim 13 wherein the portion of said conductive contacts press fitted into the plated holes includes an angular edge which engages the conductive material on the walls of said holes to deform the conductive material away from said edge and form a tight fit therewith.

15. A multi-layer printed circuit board as set forth in claim 14 wherein the portion of said conductive contacts press fitted into the plated holes is rectangular in cross section with four angular edges.

16. A multi-layer printed circuit board as set forth in claim 14 wherein the conductive material within said holes comprises an inner layer of conductive metal and an outer layer of tin-lead material.

17. A multi-layer printed circuit board as set forth in claim 13 wherein conductive patterns are formed on both sides of said single layer printed circuit boards forming said stack, and which also includes a layer of insulation between adjacent boards in said stack.

18. A multi-layer printed circuit board comprising:

a plurality of printed circuit boards each comprising a sheet of insulative material and a conductive circuit layer formed on both sides of the sheet and each having a hole formed in it that extends through said sheet and said layer, and is plated with a conductive material which is in electrical contact with the conductive layers on said sheet, said printed circuit boards being arranged in a stack and said holes being axially aligned, and a conductive contact having a plurality of angular edges press fitted into said hole, said edges deforming the conductive material within said hole to join the sheets into a unitary structure comprising a plurality of electrically interconnected layers.

19. A multi-layer printed circuit board as set forth in claim 18 wherein:

said sheets are physically separate except for said conductive contacts and wherein said contacts comprise the sole means of joining said sheets.

20. An interconnecting back panel for an electrical circuit card comprising:

a stack of single layer printed circuit boards each of which includes a sheet of insulative material having a pattern of conductive material formed on both surfaces thereof and holes arranged in rows extending through portions of the pattern of conductive material, said holes being plated with a conductive material which is in electrical contact with the conductive patterns adjacent said holes and said boards being stacked to axially align a plurality of said holes;

a thin layer of insulation between adjacent boards in said stack;

conductive printed circuit board connector contacts having a portion thereof extending above the surface of said boards and a portion having an edge press fitted through said axially aligned plated holes to deform the conductive material on the walls of the holes and produce electrical engagement with the conductive material within said holes to interconnect different ones of said contacts and frictional engagement with the conductive material on the walls of said holes to lock the individual single layer boards into a unitary multi-layer back panel; and an insulative shell covering a preselected number of rows of the portions of said contacts extending above said boards, said shell having an opening therein to receive an electrical circuit card having terminals thereon which conductively engage the contact portions within said shell.

21. An interconnecting back panel for an electrical circuit card as set forth in claim 20 wherein the portion of said conductive printed circuit board connector contacts press fitted into the plated holes includes an angular edge which engages the plating on the walls of said holes to deform the plating away from said edge and form a tight fit therebetween.

22. An interconnecting back panel for an electrical circuit card as set forth in claim 21 wherein the conductive material within said holes comprises an inner layer of conductive metal and an outer layer of tin-lead material.

* * * * *